(12) United States Patent
Yang et al.

(10) Patent No.: US 11,239,242 B2
(45) Date of Patent: Feb. 1, 2022

(54) INTEGRATED ASSEMBLIES HAVING DIELECTRIC REGIONS ALONG CONDUCTIVE STRUCTURES, AND METHODS OF FORMING INTEGRATED ASSEMBLIES

(71) Applicant: Micron Technology, Inc., Boise, ID (US)

(72) Inventors: Guangjun Yang, Meridian, ID (US); Mohd Kamran Akhtar, Boise, ID (US); Silvia Borsari, Boise, ID (US); Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/880,900

(22) Filed: May 21, 2020

(65) Prior Publication Data

US 2020/0286898 A1    Sep. 10, 2020

Related U.S. Application Data

(60) Continuation of application No. 16/419,978, filed on May 22, 2019, now Pat. No. 10,700,073, which is a
(Continued)

(51) Int. Cl.
*H01L 27/108*    (2006.01)

(52) U.S. Cl.
CPC .. *H01L 27/10885* (2013.01); *H01L 27/10814* (2013.01); *H01L 27/10852* (2013.01); *H01L 27/10855* (2013.01); *H01L 27/10888* (2013.01)

(58) Field of Classification Search
CPC ......... H01L 27/10885; H01L 27/10814; H01L 27/10852; H01L 27/10855; H01L 27/10888
(Continued)

(56) References Cited

U.S. PATENT DOCUMENTS

| 6,674,138 B1 | 1/2004 | Halliyal et al. |
| 2003/0030099 A1* | 2/2003 | Hsieh .................... H01L 29/511 257/315 |

(Continued)

OTHER PUBLICATIONS

WO PCT/US2019/016689 Srch Rpt, dated May 21, 2019, Micron Technology, Inc.
(Continued)

*Primary Examiner* — Tu-Tu V Ho
(74) *Attorney, Agent, or Firm* — Wells St. John P.S.

(57) ABSTRACT

Some embodiments include a method of forming an integrated assembly. A construction is formed to include a conductive structure having a top surface, and a pair of sidewall surfaces extending downwardly from the top surface. Insulative material is over the top surface, and rails are along the sidewall surfaces. The rails include sacrificial material. The sacrificial material is removed to leave openings. Sealant material is formed to extend within the openings. The sealant material has a lower dielectric constant than the insulative material. Some embodiments include an integrated assembly having a conductive structure with a top surface and a pair of opposing sidewall surfaces extending downwardly from the top surface. Insulative material is over the top surface. Voids are along the sidewall surfaces and are capped by sealant material. The sealant material has a lower dielectric constant than the insulative material.

31 Claims, 19 Drawing Sheets

Related U.S. Application Data division of application No. 16/002,890, filed on Jun. 7, 2018, now Pat. No. 10,347,643.

(58) Field of Classification Search
USPC ........................................................ 257/296
See application file for complete search history.

(56) References Cited

U.S. PATENT DOCUMENTS

| | | |
|---|---|---|
| 2005/0064698 A1 | 3/2005 | Chang |
| 2005/0272250 A1 | 12/2005 | Yun |
| 2006/0261392 A1 | 11/2006 | Lee |
| 2007/0241424 A1 | 10/2007 | Dalton |
| 2010/0112797 A1 | 5/2010 | Yang |
| 2014/0175659 A1 | 6/2014 | Lee |
| 2014/0306351 A1* | 10/2014 | Kim ................. H01L 21/764 257/774 |
| 2015/0171014 A1* | 6/2015 | Park ................. H01L 23/535 257/379 |
| 2015/0270225 A1* | 9/2015 | Yang ................. H01L 23/481 257/750 |
| 2015/0311112 A1 | 10/2015 | Fukuo |
| 2016/0329337 A1 | 11/2016 | Hwang |
| 2018/0040561 A1* | 2/2018 | Kim ................. H01L 23/5226 |
| 2018/0047615 A1 | 2/2018 | Cheng |
| 2019/0140019 A1 | 5/2019 | Nagel |
| 2019/0206873 A1 | 7/2019 | Kim |

OTHER PUBLICATIONS

WO PCT/US2019/016689 Wtn Opn, dated May 21, 2019, Micron Technology, Inc.
WO PCT/US2019/016689 IPRP, dated Dec. 8, 2020, Micron Technology, Inc.

* cited by examiner

INTEGRATED ASSEMBLIES HAVING DIELECTRIC REGIONS ALONG CONDUCTIVE STRUCTURES, AND METHODS OF FORMING INTEGRATED ASSEMBLIES

RELATED PATENT DATA

This application is a continuation of and claims priority to U.S. patent application Ser. No. 16/419,978, filed May 22, 2019, which is a divisional of and claims priority to U.S. patent application Ser. No. 16/002,890, filed Jun. 7, 2018, now U.S. Pat. No. 10,347,643, the disclosures of which are hereby incorporated herein by reference.

TECHNICAL FIELD

Integrated assemblies having dielectric regions along conductive structures, and methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

Some DRAM may have the digit lines coupled to portions of active regions, and may have the capacitors coupled with interconnects which extend to other portions of the active regions. The interconnects may be proximate to the digit lines, and parasitic capacitance may problematically occur between the interconnects and the digit lines. It would be desirable to develop architectures which alleviate, or even entirely prevent, such parasitic capacitance; and to develop methods of forming such architectures.

BRIEF DESCRIPTION OF THE DRAWINGS

FIGS. 1 and 3 are diagrammatic cross-sectional top-down views; and FIGS. 2, 4 and 5 are diagrammatic cross-sectional side views. The view of FIG. 1 is along the lines 1-1 of FIGS. 2 and 4. The view of FIG. 2 is along the lines 2-2 of FIGS. 1, 3, 4 and 5. The view of FIG. 3 is along the lines 3-3 of FIGS. 2, 4 and 5. The view of FIG. 4 is along the lines 4-4 of FIGS. 1, 2 and 3. The view of FIG. 5 is along the lines 5-5 of FIGS. 1, 2 and 3.

DETAILED DESCRIPTION OF THE ILLUSTRATED EMBODIMENTS

Figure 1:
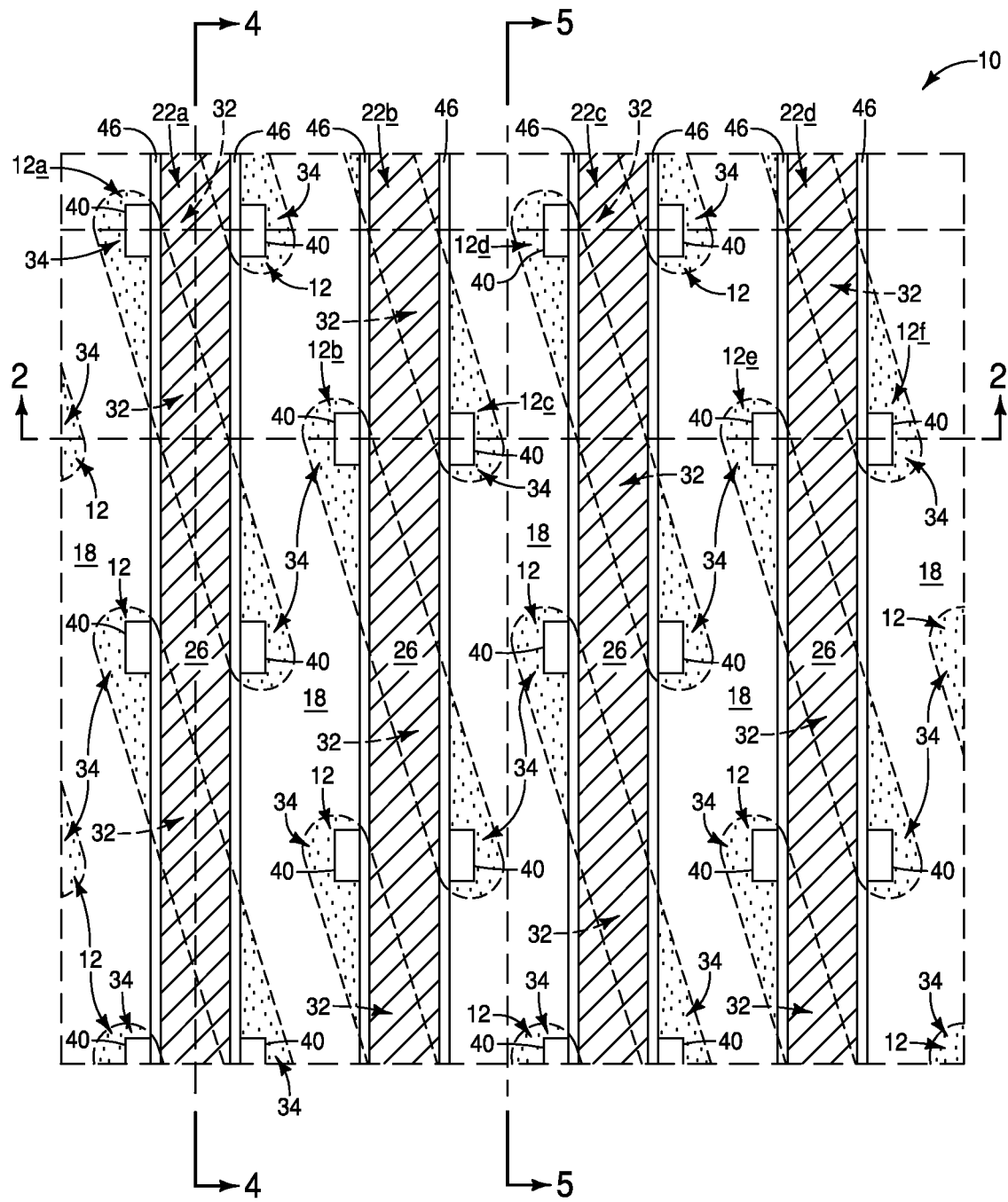
FIGS. 1-5 are diagrammatic views of a region of an example construction.

Some embodiments include architectures in which voids are along sidewalls of first conductive structures, and are capped by insulative sealant material. The sealant material may have a relatively low dielectric constant as compared to other insulative materials adjacent the first conductive structures. Second conductive structures may be spaced from the first conductive structures by intervening regions comprising the voids and the sealant material. The intervening regions have low permittivity due to the low permittivity of the voids and the sealant material; and thus problematic parasitic capacitance between the first and second conductive structures may be avoided. In some embodiments, the first conductive structures may be digit lines, and the second conductive structures may be interconnects extending to capacitors (or other suitable charge-storage structures). Some embodiments include methods of forming architectures which have low-permittivity regions between conductive structures. Example embodiments are described with reference to FIGS. 1-19.

Referring to FIGS. 1-5, a portion of an example construction 10 is illustrated. Such construction may be formed with any suitable methodology. The construction 10 may be an initial construction utilized for some of the embodiments described herein. The construction 10 is an example of an initial construction which may be utilized for some of the embodiments described herein, and it is to be understood that other constructions may be utilized alternatively to the construction 10.

The construction 10 includes a plurality of active regions 12 extending upwardly from a semiconductor base 14. Some of the active regions 12 are labeled as 12a-f so that they may be distinguished relative to one another, and relative to others of the active regions. All of the active regions 12 may be substantially identical to one another; with the term "substantially identical" meaning identical to within reasonable tolerances of fabrication and measurement.

The active regions 12 and semiconductor base 14 comprise semiconductor material 16. Such semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 16 may comprise, consist essentially of, or consist of appropriately-doped silicon. The silicon may be in any suitable form; and in some embodiments may be monocrystalline silicon.

The base 14 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The active regions 12 are spaced from one another by intervening regions comprising insulative material 18. The insulative material 18 may comprise any suitable composition or combination of compositions; and in some embodiments may comprise, consist essentially of, or consist of silicon dioxide.

Figure 3:
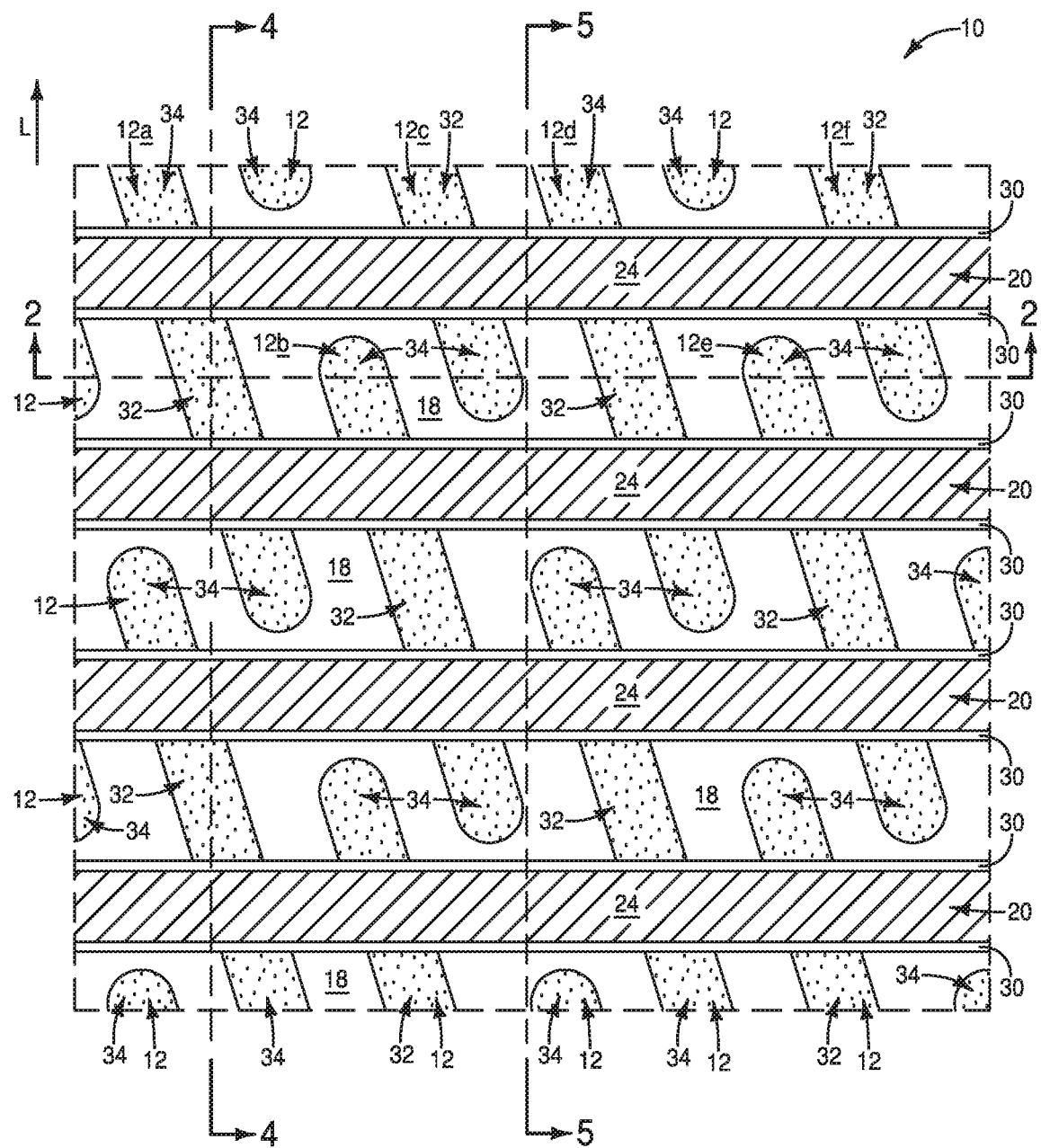

Wordlines (i.e., access lines) 20 extend along a first direction which may ultimately correspond to a row direction of a memory array; and digit lines (i.e., sense lines, bitlines) 22 extend along a second direction which may ultimately correspond to a column direction of the memory array. In the shown embodiment, the second direction of the bitlines 22 is substantially orthogonal to the first direction of the wordlines 20. The wordlines are not indicated in FIG. 1 in order to enable the active regions 12 to be fully illustrated. In practice, the wordlines pass through regions of the active regions 12, as shown in FIG. 3.

The wordlines 20 comprise conductive material 24, and the bitlines 22 comprise conductive material 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive materials 24 and 26 may be a same composition as one another; and in other embodiments the conductive materials 24 and 26 may be different compositions relative to one another.

Insulative material 28 is over the wordlines 20. Such insulative material may comprise any suitable composition(s); and in some embodiments may comprise, consist essentially of, or consist of silicon dioxide. The insulative 28 may be the same composition as the insulative material 18, or may be a different composition relative to the insulative material 18.

Gate dielectric material 30 extends around lower regions of the wordlines 20, and is between the wordlines and the active regions 12. The gate dielectric material 30 may comprise any suitable composition(s); and in some embodiments may comprise, consist essentially of, or consist of silicon dioxide.

Figure 4:
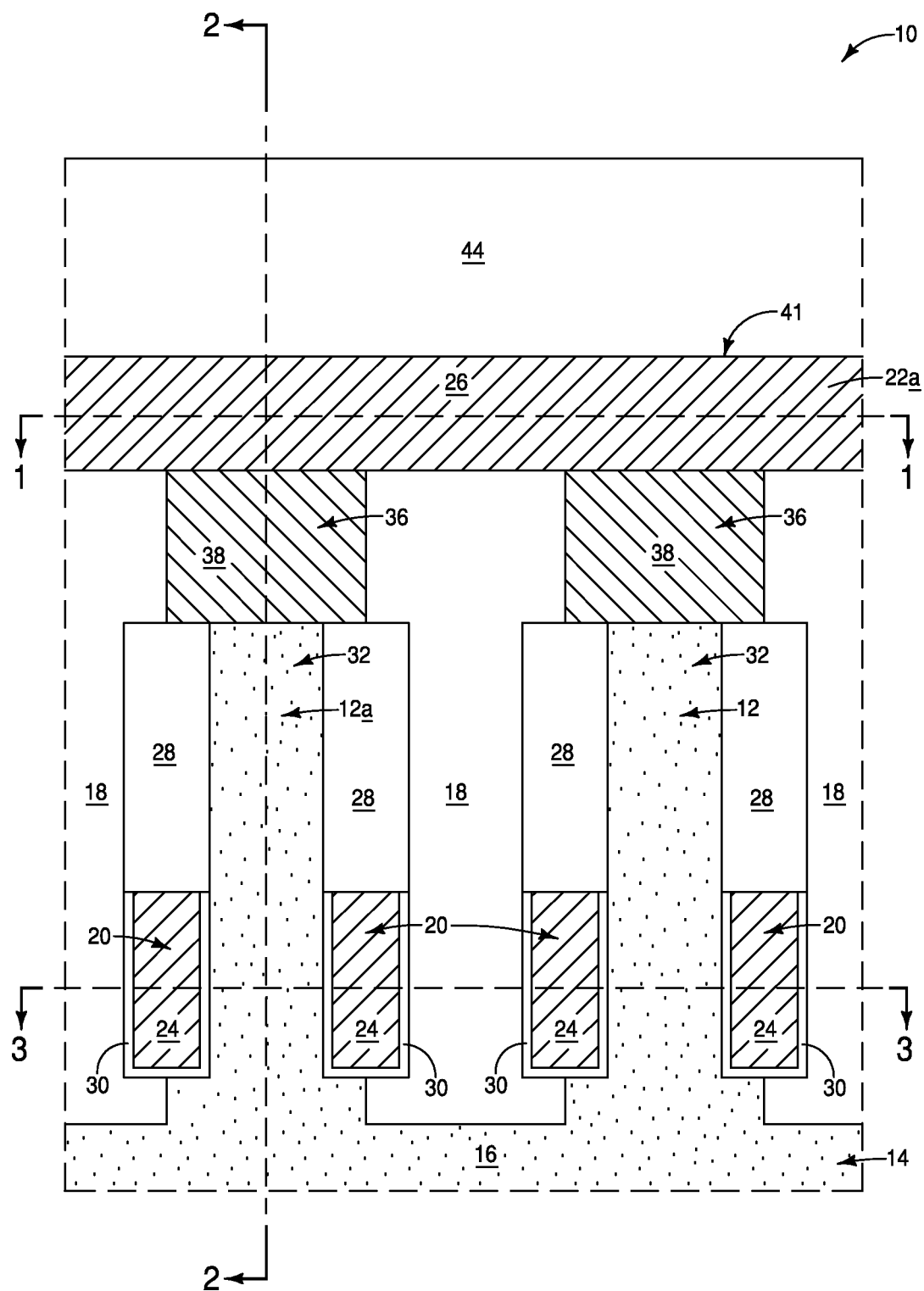
Figure 5:
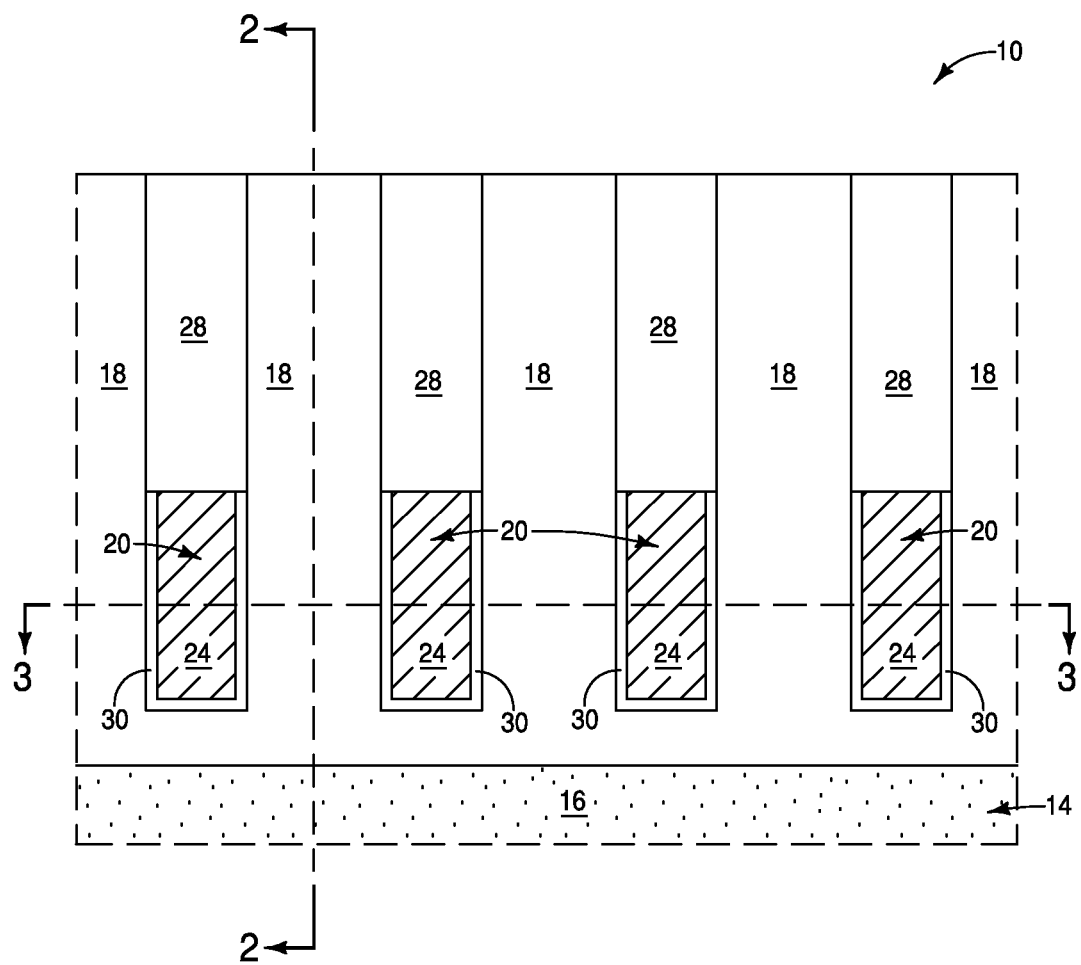

The wordlines 20 comprise transistor gates along the active regions 12. Each of the active regions may be considered to comprise a digit-line-contact portion 32, and a capacitor-contact portion 34. The transistor gates electrically couple the digit-line-contact portions with the capacitor-contact portions. The digit-line-contact portions 32 and the capacitor-contact portions 34 are indicated in FIG. 3 to assist the reader in understanding the relative locations of the wordlines 20 relative to the digit-line-contact portions 32 and the capacitor-contact portions 34. However, it is to be understood that the digit-line-contact portions 32 and the capacitor-contact portions 34 are actually higher up on the active regions than the section of FIG. 3, as is indicated in FIGS. 2 and 4.

The digit-line-contact portions 32 are coupled with electrical interconnects 36, which in turn are coupled with the digit lines 22. The interconnects 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit lines 22 are labeled as 22a-d so that they may be distinguished relative to one another. FIG. 2 shows a cross-section in which the digit lines 22a and 22c are coupled with digit-line-contact locations 32, and in which the digit lines 22b and 22d are passing over the capacitor-contact locations 34. The passing digit lines 22b and 22d are spaced from the underlying capacitor-contact locations 34 by insulative materials 40 and 42. Such insulative materials may comprise any suitable composition(s); and in some embodiments may comprise, consist essentially of, or consist of silicon dioxide, silicon nitride, etc. The insulative materials 40 and 42 may be a same composition as one another, or may be different compositions relative to one another.

Figure 2:
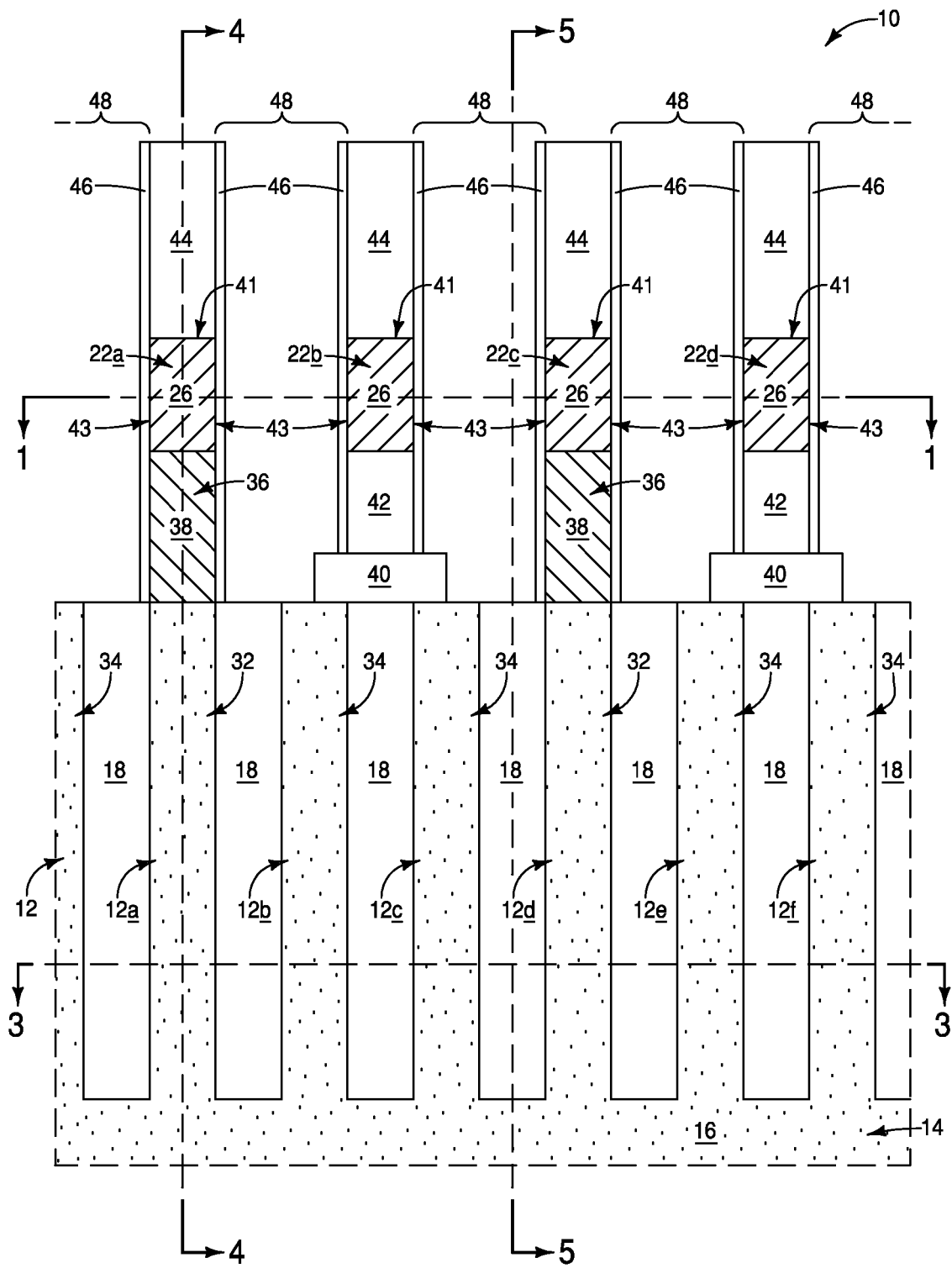

The digit lines 22 may be considered to be conductive structures having top surfaces 41, and sidewall surfaces 43; with each of the digit lines having a pair of opposing sidewall surfaces 43 along the cross-section of FIG. 2.

Insulative material 44 is over the top surfaces 41 of the conductive structures 22. The insulative material 44 may comprise any suitable composition(s); and in some embodiments may comprise, consist essentially of, or consist of silicon nitride.

Insulative material 46 is along the sidewalls 43 of the conductive structures 22. The insulative material 46 may comprise any suitable composition(s); and in some embodiments may comprise, consist essentially of, or consist of silicon nitride.

FIG. 2 shows the conductive structures 22 spaced from one another by intervening regions 48. The insulative material 46 may be considered to be formed within such intervening regions.

Figure 6:
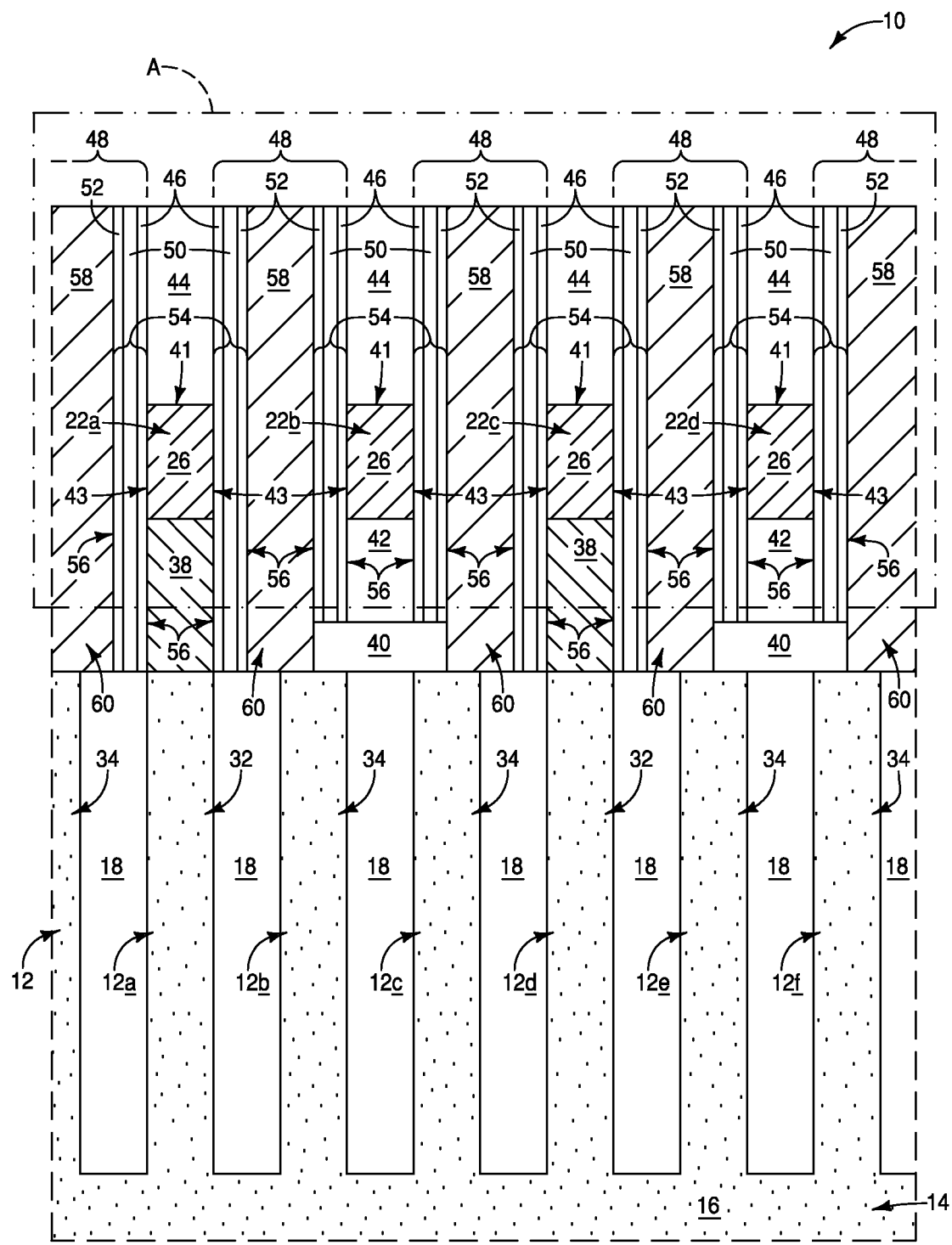
FIG. 6 is a view along the same cross-section as FIG. 2, and shows the construction of FIGS. 1-5 at an example process stage following that of FIGS. 1-5.

Referring to FIG. 6, a region of construction 10 is shown at a processing stage following that of FIGS. 1-5; with such region being shown along the same cross-section as described above relative to FIG. 2.

The processing stage of FIG. 6 has additional insulative materials 50 and 52 formed within the intervening regions 48. The insulative materials 50 and 52 may comprise any suitable composition(s). In some embodiments, the material 50 is a sacrificial material which may be removed selectively relative to the materials 44, 46 and 52. In some embodiments, the sacrificial material 50 may comprise, consist essentially of, or consist of silicon dioxide; while the materials 44, 46 and 52 may all comprise, consist essentially of, or consist of silicon nitride.

In some embodiments, the materials 46, 50 and 52 may be considered together to form rails 54, with such rails extending into and out of the page relative to the cross-section of FIG. 6 (i.e., with such rails extending along the digit lines 22 shown in FIG. 1).

The rails 54 may be considered to comprise the sacrificial material 50 between a pair of panels 56; with such panels comprising the non-sacrificial materials 46 and 52.

Conductive material 58 is formed within the intervening regions 48 between the rails 54. The conductive material 58 forms conductive interconnects 60 which extend to the capacitor-contact locations 34 of the active regions 12.

The conductive material 58 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Figure 7:
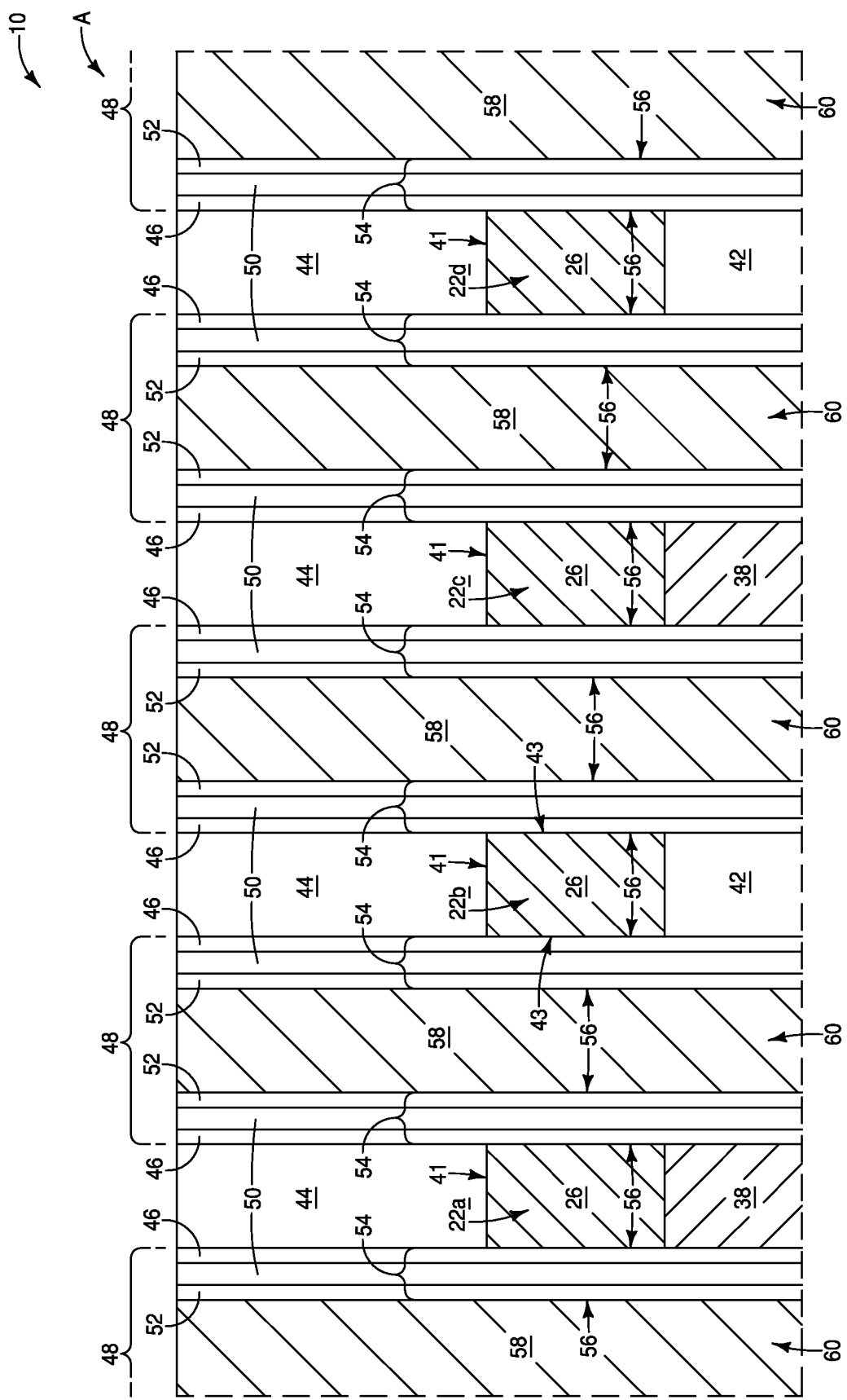
FIG. 7 is a diagrammatic cross-sectional view of a region "A" of FIG. 6 at the same process stage as FIG. 6.

The processing which follows pertains to structures fabricated within an upper portion of the construction 10 of FIG. 6. Such upper portion is diagrammatically illustrated in FIG. 6 is corresponding to a region "A". The region "A" is shown in FIG. 7, and is utilized for describing the embodiments which follow. The processing stage of FIG. 7 is identical to that of FIG. 6.

Figure 8:
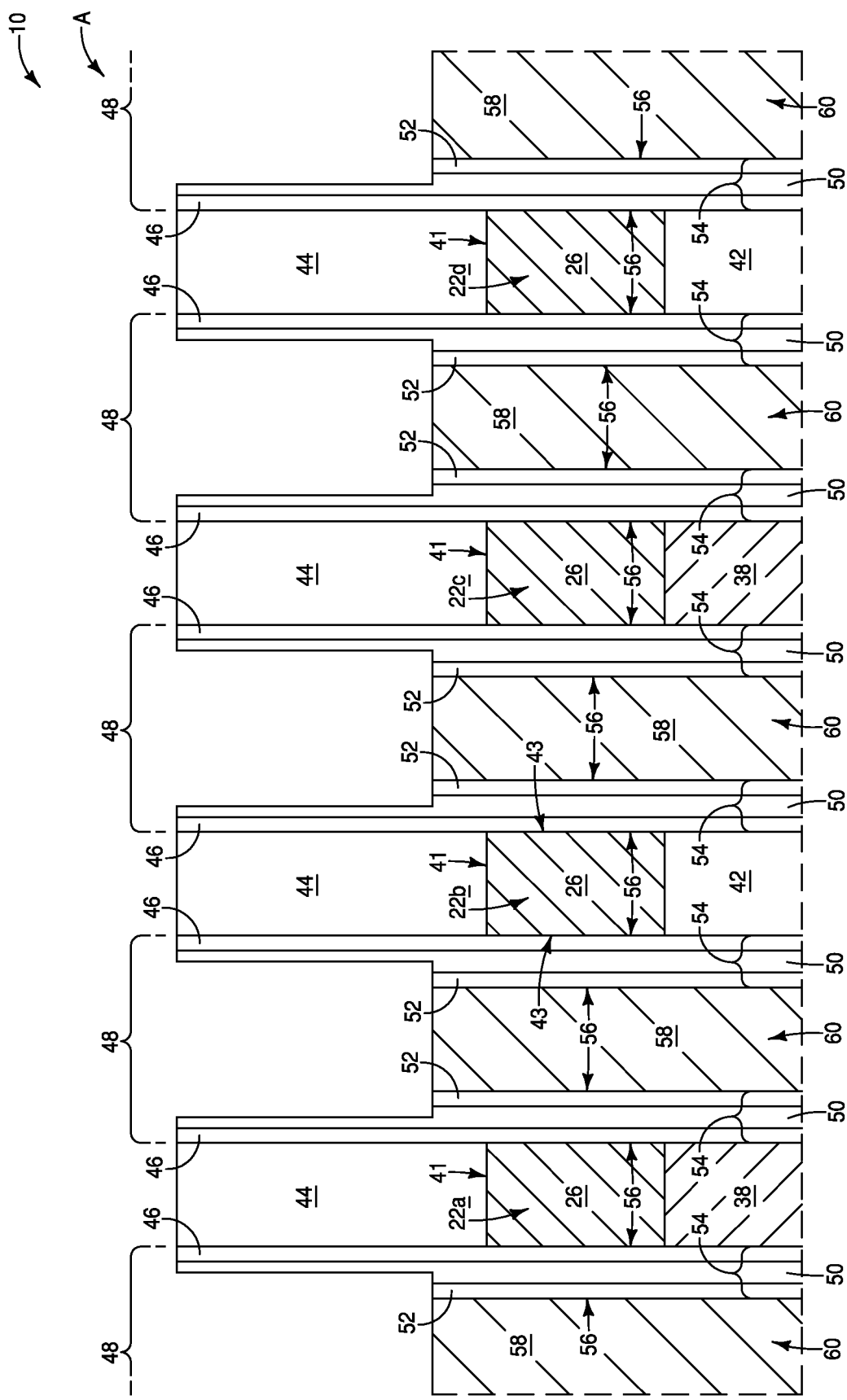
FIGS. 8-14 are diagrammatic cross-sectional views of the region "A" of FIG. 7 at example process stages which may follow the process stage of FIG. 7.

Referring to FIG. 8, portions of the materials 50, 52 and 58 within the intervening regions 48 are recessed. Such may be accomplished utilizing a mask (not shown) to protect some regions of the construction 10, while leaving other regions exposed to suitable etching which recesses the exposed regions. Subsequently, the protective mask may be removed to leave the construction shown in FIG. 8. Alternatively, at least some portions of the mask may remain at the process stage of FIG. 8.

Figure 9:
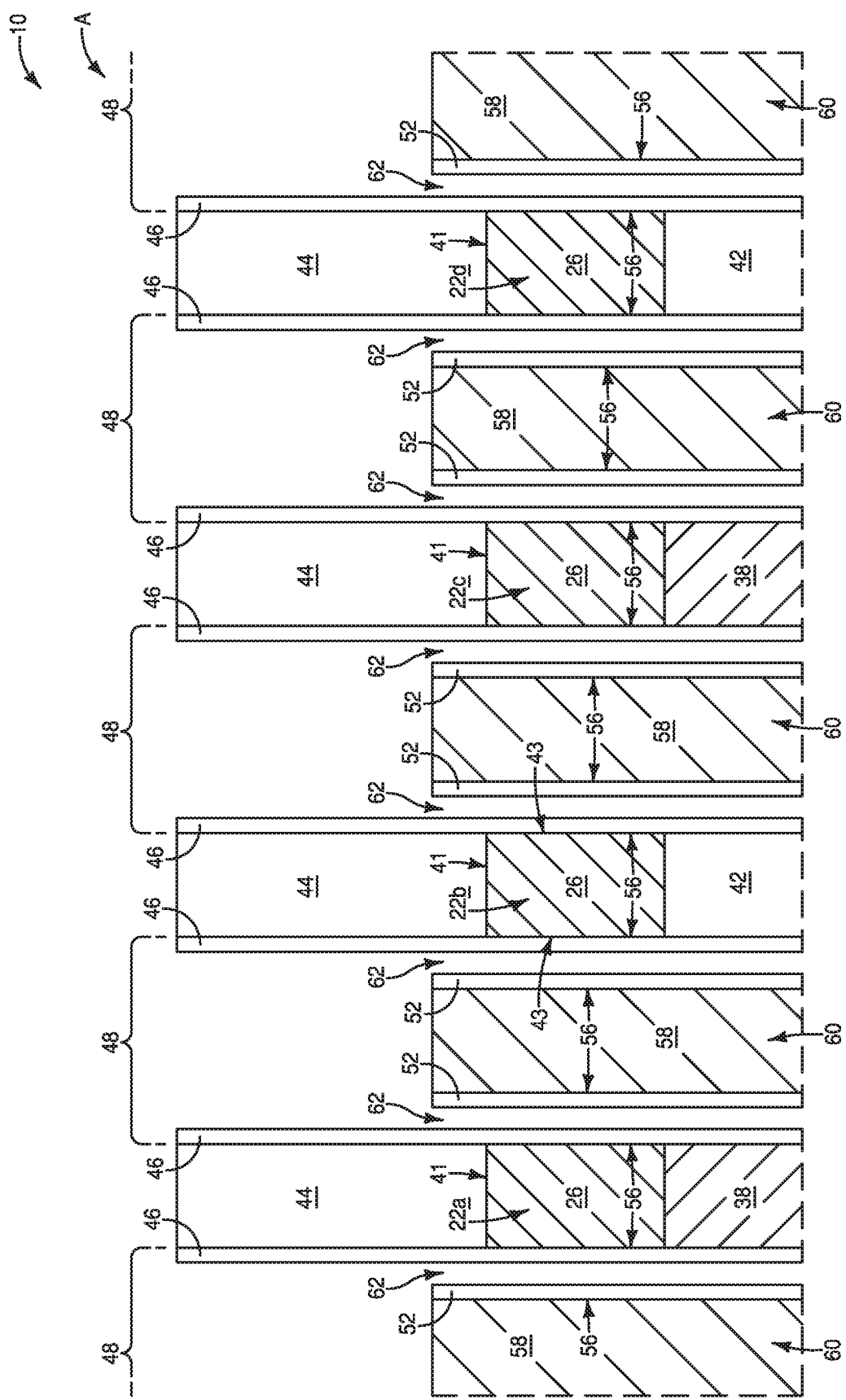

Referring to FIG. 9, the sacrificial material 50 (FIG. 8) is removed selectively relative to the materials 44, 46 and 52 to leave openings 62 remaining between the panels 56. The bottoms of the openings 62 are not shown in FIG. 9; but would be capped by the materials 18 and 40 shown in FIG. 6.

Figure 10:
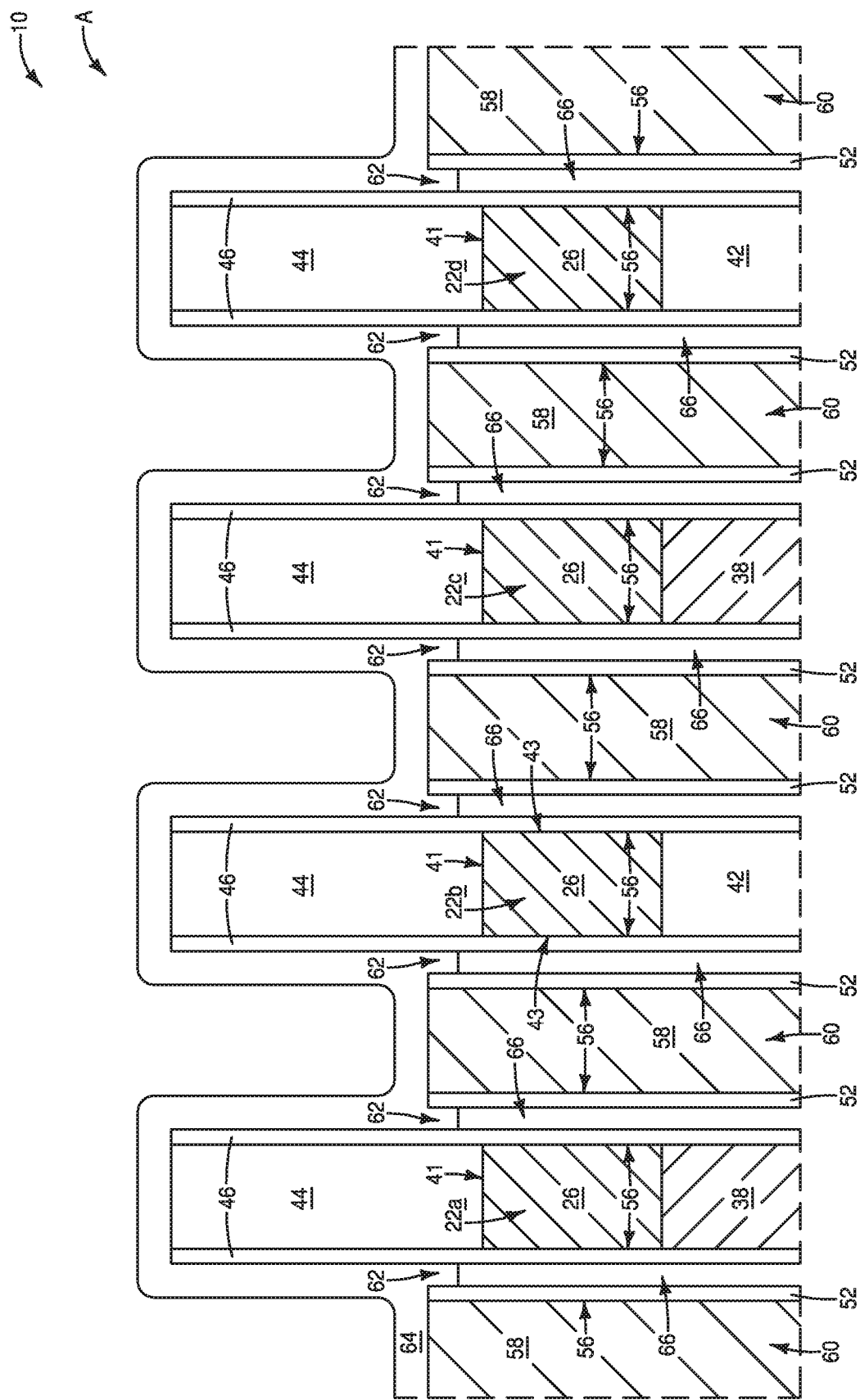

Referring to FIG. 10, sealant material 64 is formed within the openings 62. In the shown embodiment, the sealant material only extends partially into the openings 62, and leaves voids 66 along the sidewall surfaces 43 of the conductive structures 22 (with the voids being spaced from the sidewall surfaces 43 of the conductive structures 22 by material 46).

The sealant material 64 may comprise any suitable composition(s). In some embodiments, the sealant material may have a relatively low dielectric constant; or at least may have a lower dielectric constant than the insulative material 44. For instance, in some embodiments the insulative material 44 may comprise silicon nitride having a first dielectric constant, and the sealant material 64 may comprise silicon nitride having a second dielectric constant which is less than the first dielectric constant. In some embodiments, the silicon nitride of the insulative material 44 may have a dielectric constant of at least about 7, and the silicon nitride of the sealant material may have a dielectric constant of less than about 6. In some embodiments, the silicon nitride of the sealant material 64 may be formed to be more porous than the silicon nitride of the insulative 44, and to thereby have a lower dielectric constant than the silicon nitride of the insulative material 44.

In some embodiments, the sealant material 64 may be a low-k material (i.e., a material having a dielectric constant less than 3.9, which is the dielectric constant of conventional silicon dioxide). In such embodiments, the sealant material may comprise silicon dioxide which is formed to be more porous (i.e., which is formed to be less dense) then conventional silicon dioxide. As another example, in some embodiments the low-k sealant material may comprise silicon dioxide having carbon incorporated therein (i.e., may comprise carbon-doped silicon dioxide). Any suitable amount of carbon may be within the carbon-doped silicon dioxide; and in some embodiments the amount of carbon within the carbon-doped silicon dioxide may be within a range of from about 2 atomic percent to about 20 atomic percent. In some embodiments, the sealant material may comprise silicon dioxide, and may have a dielectric constant of less than about 3.5.

Figure 11:
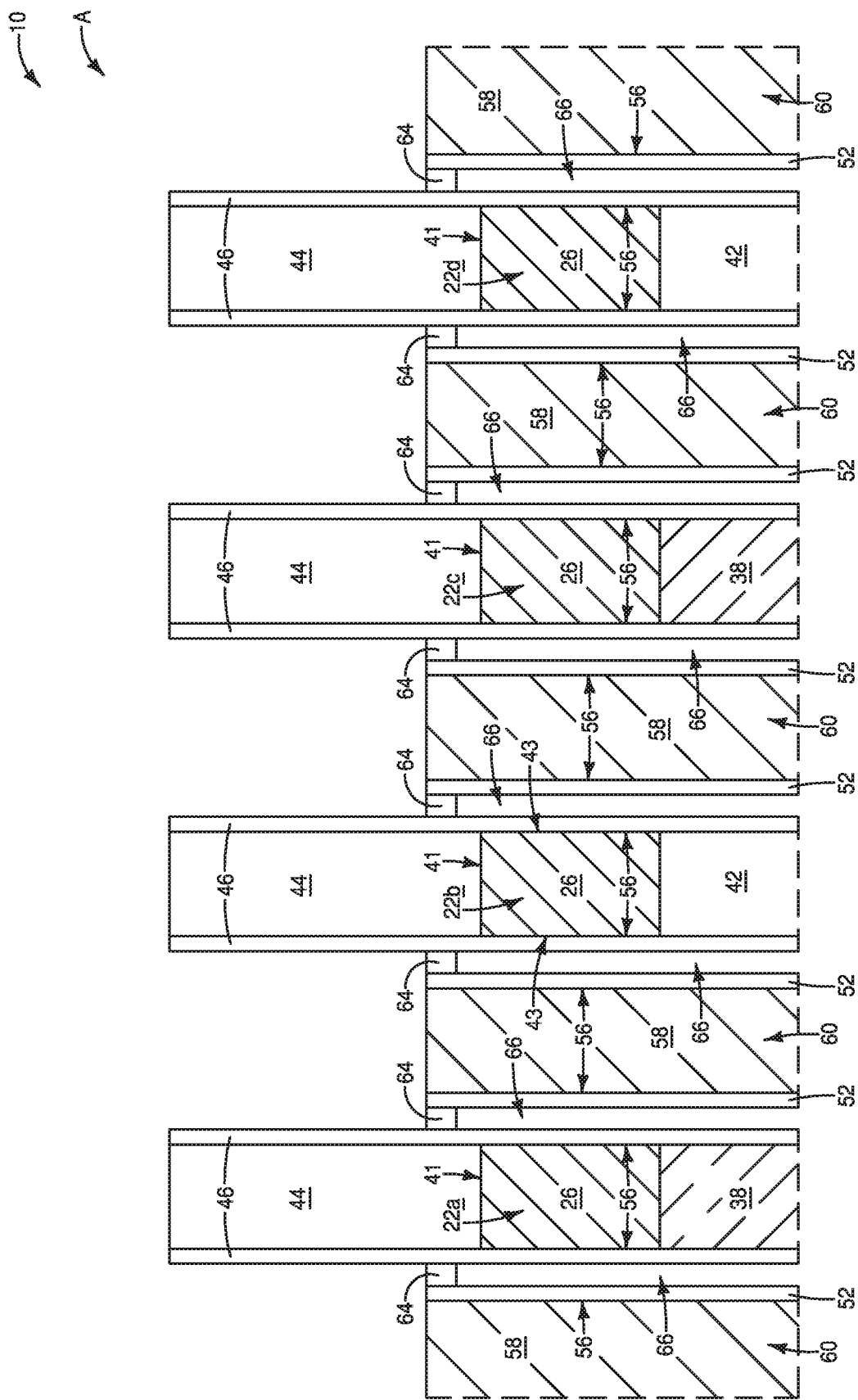

Referring to FIG. 11, excess sealant material 64 is removed from over the insulative material 44 and from over the conductive interconnects 60.

Figure 12:
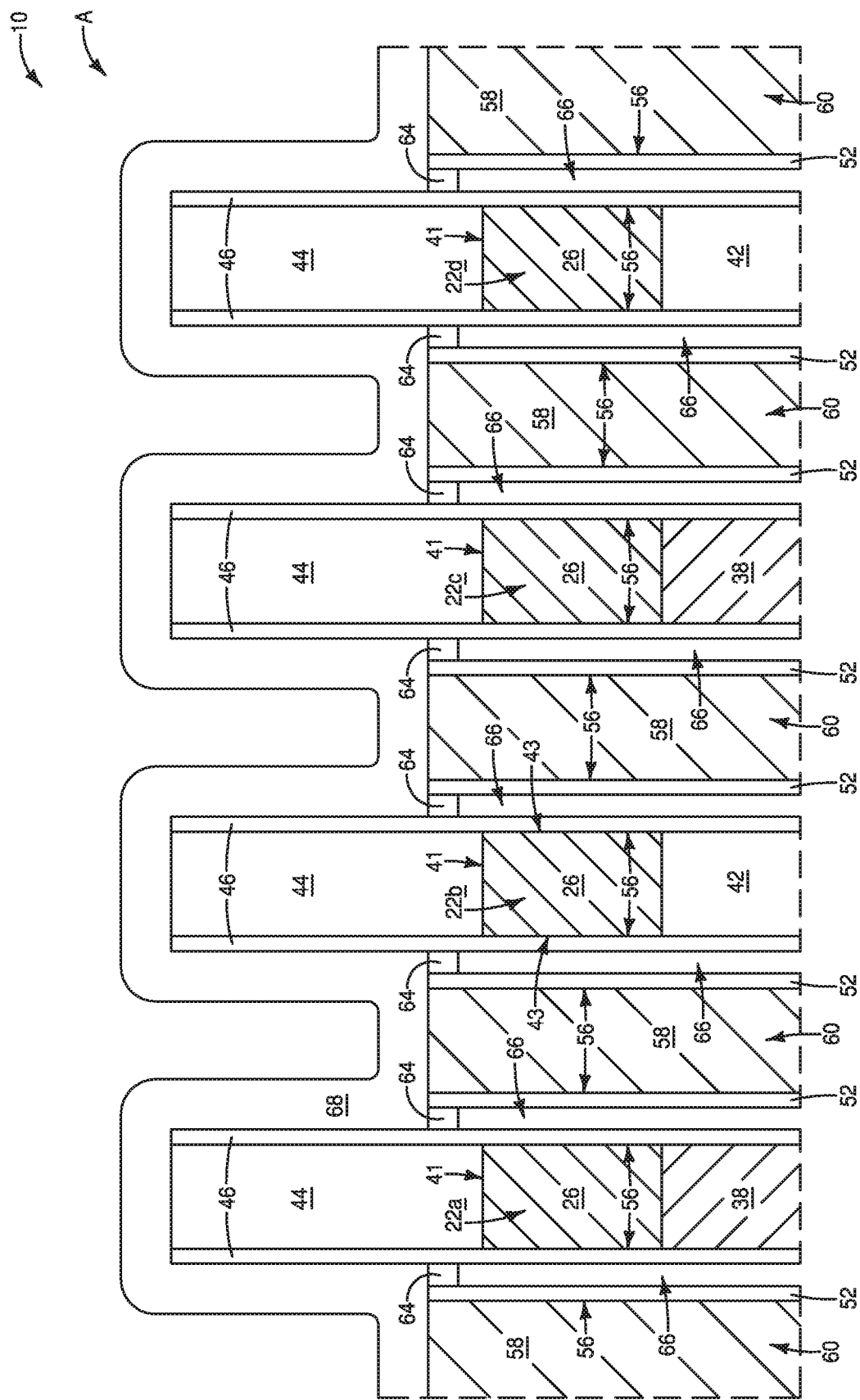

Referring to FIG. 12, insulative material 68 is formed across the insulative material 44, across the sealant material 64, and across the conductive interconnects 60. In some embodiments, the insulative material 44 may be referred to as a first insulative material, and the insulative material 68 may be referred to as a second insulative material. The second insulative material 68 may comprise any suitable composition(s); and in some embodiments may comprise, consist essentially of, or consist of silicon nitride. The first and second insulative materials 44 and 68 may comprise a same composition as one another, or may comprise different compositions relative to one another.

Figure 13:
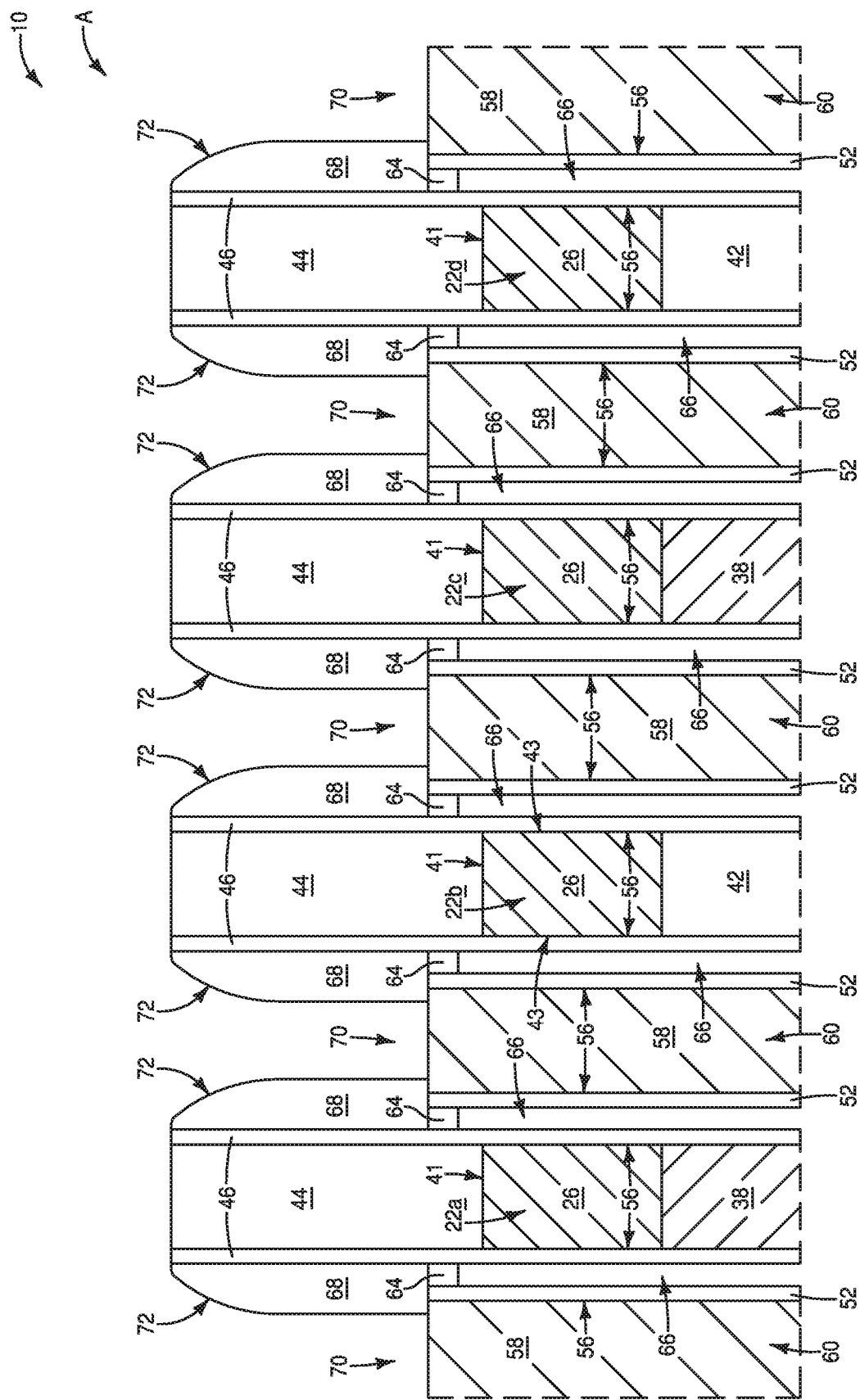

Referring to FIG. 13, portions of the second insulative material 68 are removed to expose regions 70 of the conductive interconnects 60. Such removal may be accomplished utilizing anisotropic etching of the insulative material 68, which forms the insulative material 68 into spacers 72.

Figure 14:
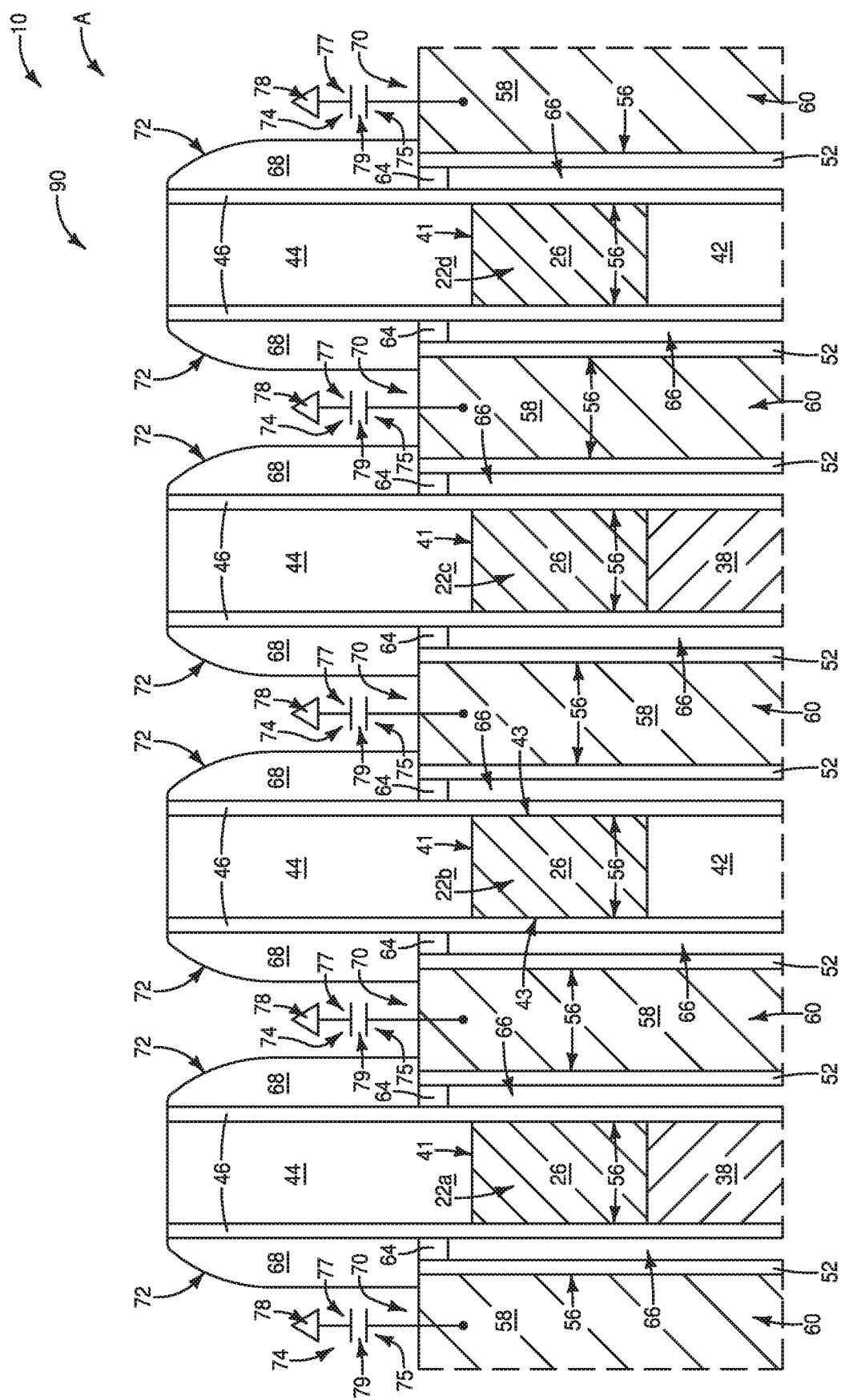

Referring to FIG. 14, the exposed regions 70 of the interconnects 60 are coupled with capacitors 74. Each capacitor has a node 75 connected with an interconnect 60, and has another node 77 connected with a reference voltage 78. The reference voltage may be ground or any other suitable voltage. The nodes 75 and 77 are spaced from one another by dielectric regions 79. Such dielectric regions may comprise any suitable dielectric material(s).

The capacitors 74 are examples of charge-storage devices which may be coupled with the conductive interconnects 60. In other embodiments, other suitable charge-storage devices may be utilized. Accordingly, it is to be understood that the so-called capacitor-contact locations 34 of FIGS. 1-6 may be more generically referred to as charge-storage-device-contact locations.

The configuration of FIG. 14 may be considered to correspond to a region of a memory array 90 (for instance, a DRAM array). The memory array comprises memory cells which include an access transistor (e.g., a transistor comprising a gate along one of the wordlines 20 of FIGS. 1-5) coupled with a charge-storage device (e.g., a capacitor 74). An example memory array 90 is described with reference to FIG. 15. The memory array includes digit lines (DL1-DL4) corresponding to the digit lines 22a-d, and includes wordlines (WL1-WL4) corresponding to the wordlines 20. Memory cells 80 comprise transistors 82 coupled with the capacitors 74. Each of the transistors comprises a gate 84 along one of the wordlines 20. Each of the memory cells 80 is uniquely addressed through the combination of a wordline and a digit line.

Figure 15:
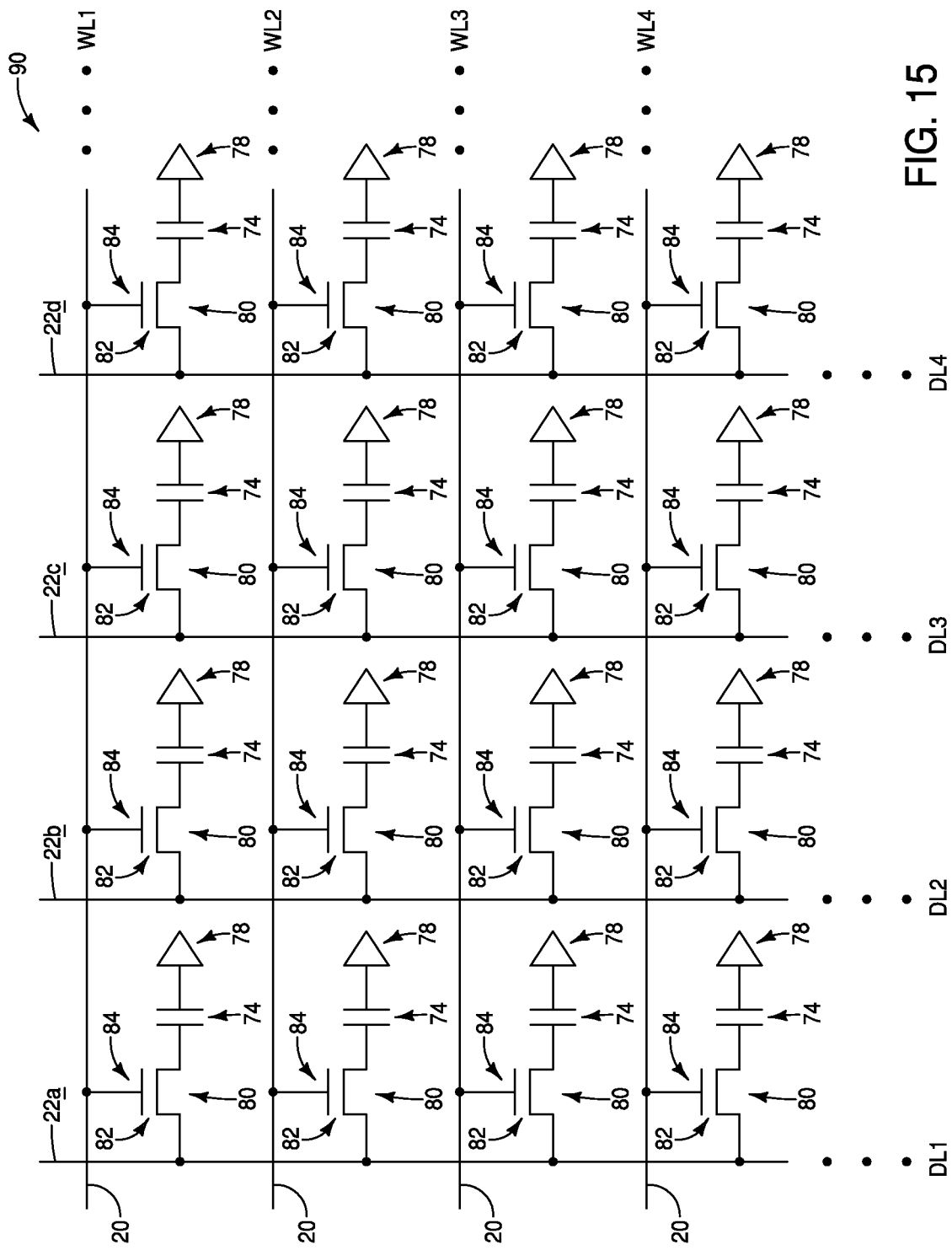
FIG. 15 is a diagrammatic schematic view of a region of an example memory array.

The memory array 90 of FIG. 15 is a DRAM array in which each of the memory cells 80 comprises a transistor and a capacitor. In other embodiments, configurations analogous to that of FIG. 14 may be utilized in other memory arrays. Also, it is to be understood that the methodology described herein may be utilized to form other integrated assemblies in addition to, or alternatively to, memory arrays. For instance, the utilization of the sealant technologies described with reference to FIG. 7-14 may be applied to the fabrication of logic, sensors, etc.

The configuration of FIG. 14 comprises conductive structures 22 having top surfaces 41 and sidewall surfaces 43. The insulative material 44 is over the top surfaces. The voids 66 are along the sidewall surfaces, and are laterally spaced from such sidewall surfaces by the insulative material 46. In some embodiments, the insulative materials 44 and 46 may be referred to as first and second insulative materials, respectively. Such first and second insulative materials may comprise a same composition as one another (for instance, may both comprise silicon nitride), or may comprise different compositions relative to one another.

The voids 66 have low dielectric constant, and thus form regions of low permittivity between the digit lines 22 and the conductive interconnects 60. In some embodiments, some of the sealant material 64 may be along the sidewall surfaces 43 of the conductive structures 22, and may thus be within regions between the conductive structures 22 and the conductive interconnects 60. The sealant material 64 may have a relatively low dielectric constant. Thus, in configurations in which both of the sealant material 64 and the void 66 are between the conductive structures 22 and the conductive interconnects 60, the sealant material 64 and voids 66 may be together considered to form low-permittivity regions. Such low-permittivity regions may reduce, or even entirely eliminate, problematic parasitic capacitance between the conductive structures 22 and the conductive interconnects 60 as compared to conventional configurations lacking such low-permittivity regions.

The embodiment of FIG. 14 has voids 66 along the sidewalls 43 of the conductive structures 22. In other embodiments, the sealant material 64 may extend entirely along such sidewall surfaces. FIG. 16-19 illustrate an example embodiment in which the sealant material 64 is formed to extend entirely along the sidewall surfaces 43.

Figure 16:
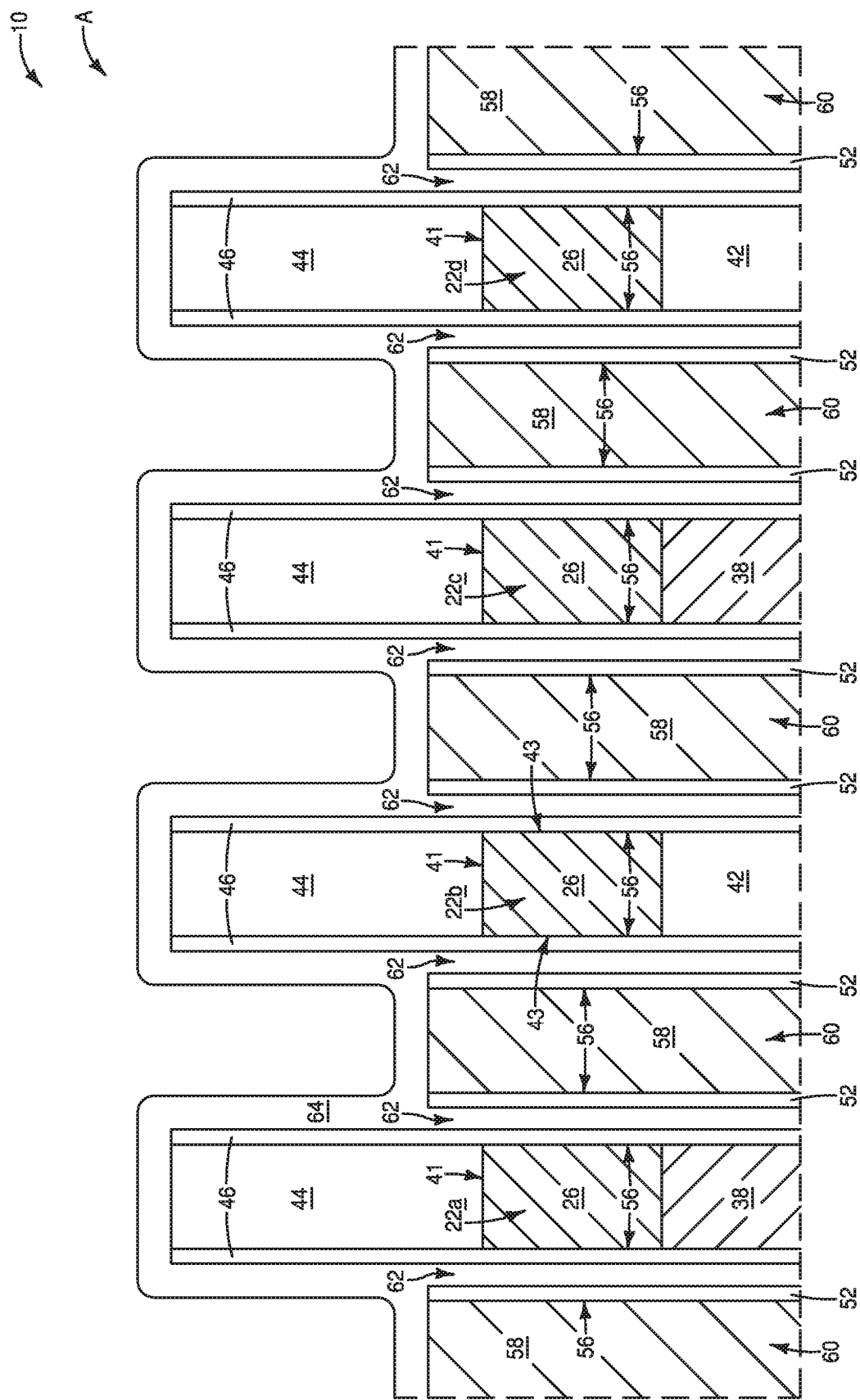
FIGS. 16-19 are diagrammatic cross-sectional views of the region "A" of FIG. 7 at example process stages which may follow the process stage of FIG. 7.

Referring to FIG. 16, the construction 10 is shown at a processing stage subsequent to that of FIG. 9. The sealant material 64 entirely fills the openings 62, and thus extends entirely along the sidewall surfaces 43 of the conductive structures 22.

Figure 17:
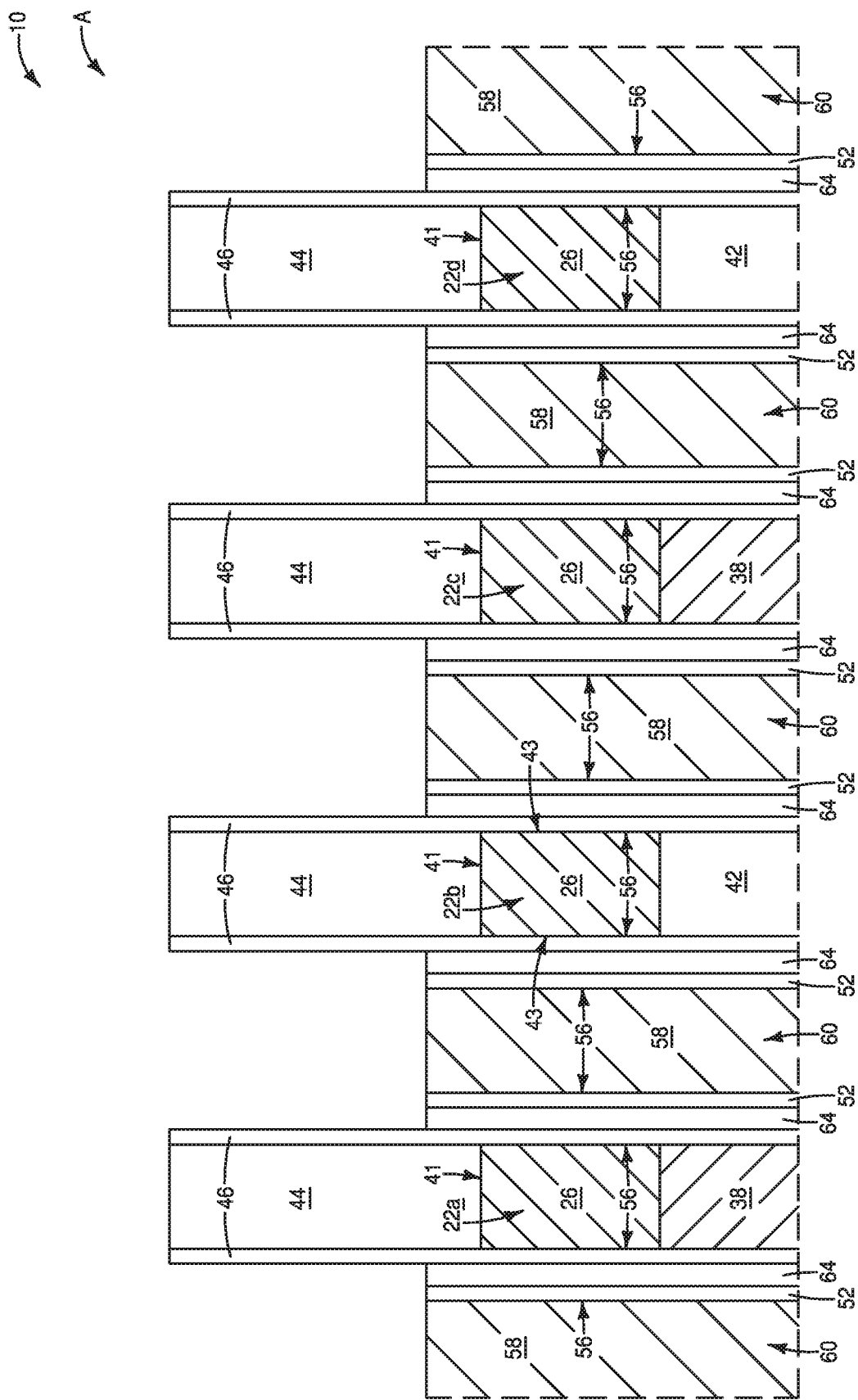

Referring to FIG. 17, excess sealant material 64 is removed with processing analogous to that described above with reference to FIG. 11.

Figure 18:
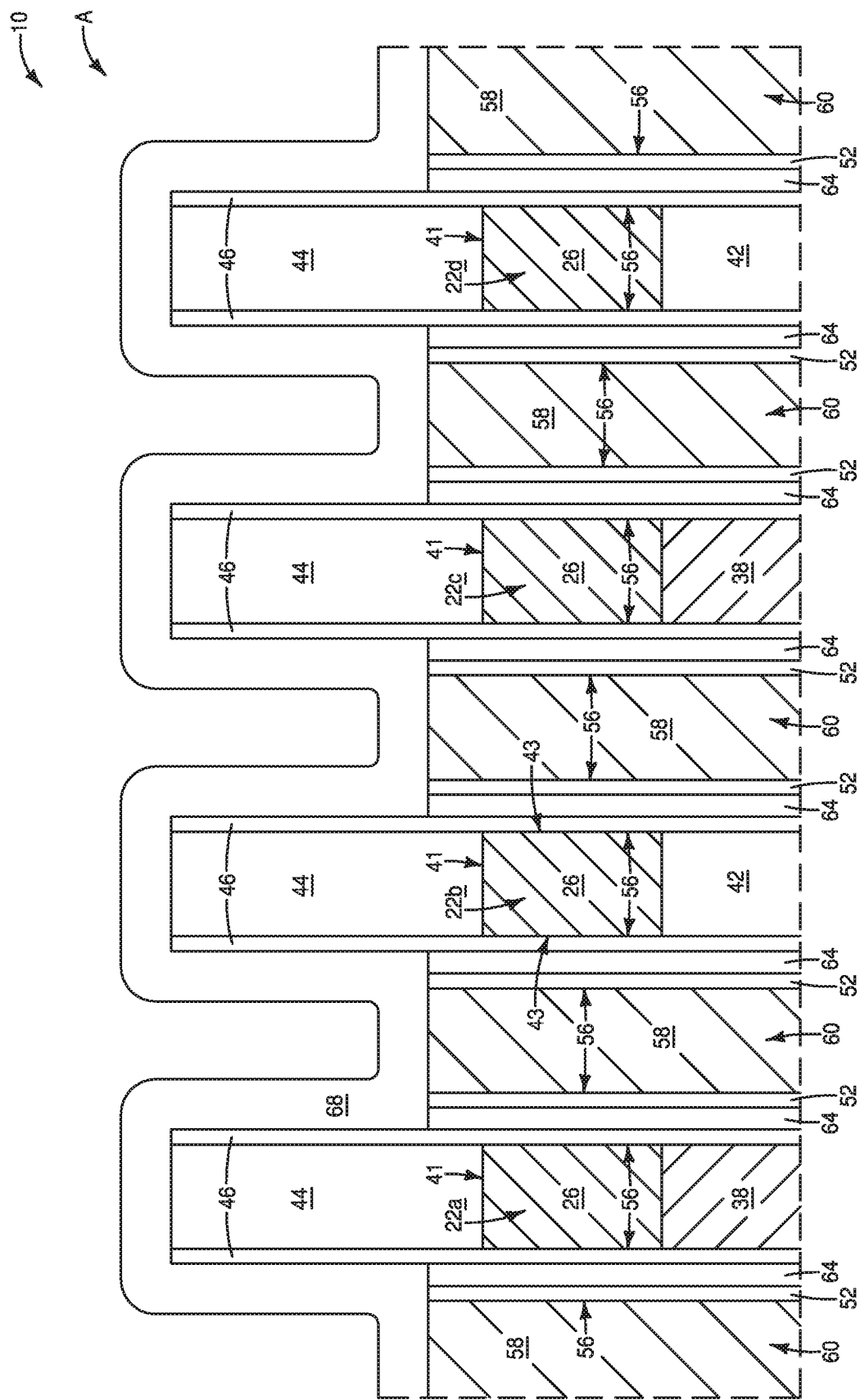

Referring to FIG. 18, the insulative material 68 is formed over the conductive interconnects 60, the sealant material 64, the insulative material 46, and the insulative material 44.

Figure 19:
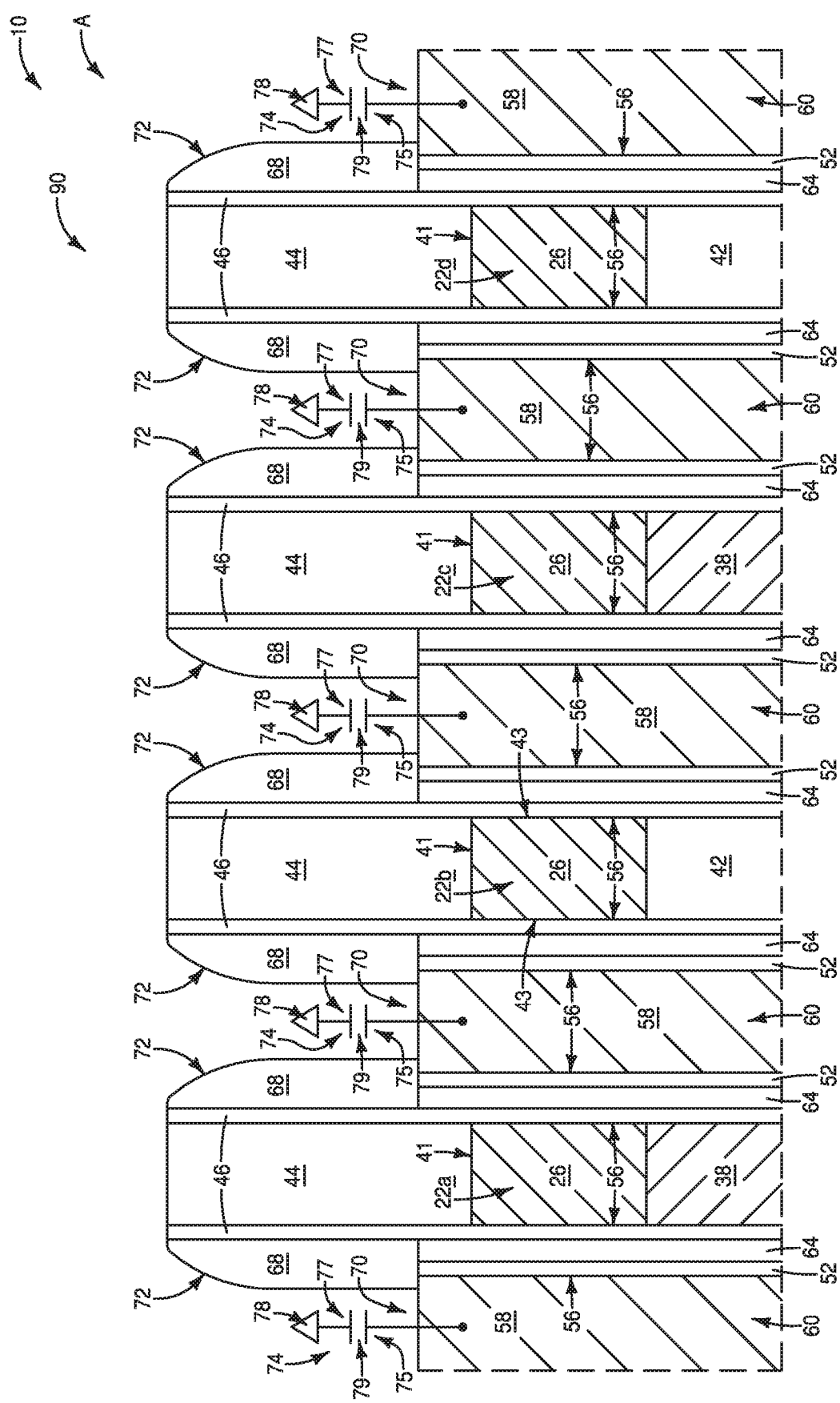

Referring to FIG. 19, portions of the insulative 68 are removed to expose regions 70 of the interconnects 60. Capacitors 74 (or other suitable charge-storage devices) are coupled with the exposed regions of the conductive interconnects 60 to form a memory array 90 analogous to that described above with reference to FIGS. 14 and 15.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated assembly. A construction is formed to include, along a cross-section, a conductive structure having a top surface, and having a pair of opposing sidewall surfaces extending downwardly from the top surface. The construction also includes insulative material over the top surface, and includes rails along the sidewall surfaces. Each of the rails includes a sacrificial material along a panel of a non-sacrificial material. The sacrificial material is removed to leave openings between the sidewall surfaces and the panels of the non-sacrificial material. Sealant material is formed to extend within the openings. The sealant material has a lower dielectric constant than the insulative material.

Some embodiments include a method of forming an integrated assembly. A construction is formed to include, along a cross-section, a pair of digit lines spaced from one another by an intervening region. Each of the digit lines has a top surface, and has a pair of opposing sidewall surfaces extending downwardly from the top surface. The construction includes first insulative material over the top surfaces, and includes rails along the sidewall surfaces. The rails comprise a sacrificial material sandwiched between a pair of panels. The construction includes a conductive interconnect within the intervening region. The sacrificial material is removed to leave openings between the panels. Sealant material is formed to extend within the openings. The sealant material has a lower dielectric constant than the first insulative material. Second insulative material is formed across the first insulative material, across the sealant material and across the conductive interconnect. A portion of the second insulative material is removed to expose a region of the conductive interconnect. The exposed region of the conductive interconnect is coupled with a charge-storage device.

Some embodiments include an integrated assembly having, along a cross-section, a conductive structure with a top surface and a pair of opposing sidewall surfaces extending downwardly from the top surface. Insulative material is over the top surface. Voids are along the sidewall surfaces and are capped by sealant material. The sealant material has a lower dielectric constant than the insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising, along a cross-section:
   a conductive structure having a top surface and a pair of opposing sidewall surfaces extending downwardly from the top surface;
   a device coupled to a top portion of the conductive structure; and
   voids along the sidewall surfaces and capped with a material adjacent the top surface of the conductive structure, below the material, at least one of the voids extending along an entire length of at least one of the sidewall surfaces of the conductive structure.

2. The integrated assembly of claim 1 wherein the voids are capped by insulative material.

3. The integrated assembly of claim 1 wherein the voids are capped by sealant material.

4. The integrated assembly of claim 1 wherein the voids are spaced from the sidewall surfaces of the conductive structure by an insulative material.

5. The integrated assembly of claim 1 wherein the voids are capped by sealant material and the sealant material comprises silicon dioxide having a dielectric constant of less than about 3.5.

6. The integrated assembly of claim 5 wherein the silicon dioxide is porous.

7. The integrated assembly of claim 5 wherein the silicon dioxide is doped with carbon.

8. The integrated assembly of claim 7 wherein an amount of carbon within the carbon-doped silicon dioxide is within a range of from about 2 atomic percent to about 20 atomic percent.

9. The integrated assembly of claim 1 wherein the device comprises a capacitor.

10. The integrated assembly of claim 1 wherein the conductive structure comprises an interconnect structure.

11. The integrated assembly of claim 1 further comprising an insulative layer extending along an entire length of one of the pair of the sidewall surfaces of the conductive structure.

12. The integrated assembly of claim 1 further comprising an insulative layer extending along the conductive structure and comprising a lowermost surface, and wherein the at least one void extending along the insulative layer and defined by a bottommost surface coplanar with the lowermost surface of the insulative layer.

13. The integrated assembly of claim 1 wherein an entirety of the material capping the voids is below the top surface of the conductive structure.

14. An integrated assembly comprising, along a cross-section:
   a conductive structure having a top surface and a pair of opposing sidewall surfaces extending downwardly from the top surface;
   a first insulative layer extending along one of the sidewall surfaces of the conductive structure, the first insulative layer extending along an entire length of the one sidewall surface of the conductive structure; and
   a void extending along the first insulative layer, the void capped with a material composition different from material composition of the first insulative layer.

15. The integrated assembly of claim 14 further comprising a second insulative layer extending along the void.

16. The integrated assembly of claim 14 further comprising a second insulative layer over the top surface of the conductive structure.

17. The integrated assembly of claim 14 further comprising:
   a second insulative layer over the top surface of the conductive structure; and
   a third insulative layer extending along the void.

18. The integrated assembly of claim 14 further comprising sealant material as the material capping the void.

19. The integrated assembly of claim 14 further comprising:
   sealant material as the material capping the void; and
   a second insulative layer over the top surface of the conductive structure.

20. The integrated assembly of claim 19 wherein the sealant material comprises a lower dielectric constant than the second insulative material.

21. The integrated assembly of claim 19 wherein the sealant material is more porous than the second insulative material.

22. The integrated assembly of claim 14 wherein below the material composition capping the void, the void extending along an entire length of at least one of the pair of the sidewall surfaces of the conductive structure.

23. The integrated assembly of claim 14 wherein the first insulative layer comprises a lowermost surface, and wherein the void is defined by a bottommost surface coplanar with the lowermost surface of the first insulative layer.

24. An integrated assembly comprising, along a cross-section:
   a conductive structure having a top surface and a pair of opposing sidewall surfaces extending downwardly from the top surface;
   a device coupled to the top portion of the conductive structure;
   voids along the sidewall surfaces of the conductive structure;
   wherein the voids are capped by sealant material and the sealant material comprises silicon dioxide having a dielectric constant of less than about 3.5;
   wherein the silicon dioxide is doped with carbon; and
   wherein an amount of carbon within the carbon-doped silicon dioxide is within a range of from about 2 atomic percent to about 20 atomic percent.

25. The integrated assembly of claim 24 wherein the silicon dioxide is porous.

26. An integrated assembly comprising, along a cross-section:
   a conductive structure having a top surface and a pair of opposing sidewall surfaces extending downwardly from the top surface;
   a first insulative layer extending along one of the sidewall surfaces of the conductive structure;
   a void extending along the first insulative layer;
   sealant material capping the void;
   a second insulative layer over the top surface of the conductive structure, and an entirety of the structure of the sealant material is below an uppermost surface of the second insulative layer; and wherein the sealant material comprises a lower dielectric constant than the second insulative material.

27. The integrated assembly of claim 26 wherein the first insulative layer comprises a lowermost surface, and wherein the void is defined by a bottommost surface coplanar with the lowermost surface of the first insulative layer.

28. The integrated assembly of claim 26 wherein the first wherein the sealant material comprises silicon dioxide doped with carbon, and wherein an amount of carbon within the carbon-doped silicon dioxide is within a range of from about 2 atomic percent to about 20 atomic percent.

29. An integrated assembly comprising, along a cross-section:

a conductive structure having a top surface and a pair of opposing sidewall surfaces extending downwardly from the top surface;

a first insulative layer extending along one of the sidewall surfaces of the conductive structure and comprising a lowermost surface;

a void extending along the first insulative layer and defined by a bottommost surface coplanar with the lowermost surface of the first insulative layer;

sealant material capping the void;

a second insulative layer over the top surface of the conductive structure; and wherein the sealant material is more porous than the second insulative material.

30. The integrated assembly of claim 29 wherein the first wherein the sealant material comprises silicon dioxide doped with carbon, and wherein an amount of carbon within the carbon-doped silicon dioxide is within a range of from about 2 atomic percent to about 20 atomic percent.

31. The integrated assembly of claim 29 wherein an entirety of the structure of the sealant material is below an uppermost surface of the second insulative layer.

* * * * *